(12) United States Patent
Huisman et al.

(10) Patent No.: US 11,221,565 B2
(45) Date of Patent: Jan. 11, 2022

(54) LEVEL SENSOR AND LITHOGRAPHIC APPARATUS

(71) Applicant: ASML Netherlands B.V., Veldhoven (NL)

(72) Inventors: Simon Reinald Huisman, Eindhoven (NL); Marinus Petrus Reijnders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/044,674

(22) PCT Filed: Mar. 13, 2019

(86) PCT No.: PCT/EP2019/056288
§ 371 (c)(1),
(2) Date: Oct. 1, 2020

(87) PCT Pub. No.: WO2019/197111
PCT Pub. Date: Oct. 17, 2019

(65) Prior Publication Data
US 2021/0072652 A1  Mar. 11, 2021

(30) Foreign Application Priority Data
Apr. 11, 2018  (EP) .................................. 18166754

(51) Int. Cl.
*G03F 9/00*   (2006.01)
*G03F 7/20*   (2006.01)
(52) U.S. Cl.
CPC ........ *G03F 9/7034* (2013.01); *G03F 7/70625* (2013.01); *G03F 9/7026* (2013.01)
(58) Field of Classification Search
CPC ....... G03F 9/7023–7034; G03F 9/7065; G03F 9/7088; G03F 9/7096; G03F 7/70625;
(Continued)

(56) References Cited

U.S. PATENT DOCUMENTS

| 4,924,082 A | * | 5/1990 | Opheij | ................... | G11B 19/12 |
| | | | | | 250/216 |
| 5,191,200 A | * | 3/1993 | van der Werf | ....... | G02B 21/241 |
| | | | | | 250/201.4 |

(Continued)

FOREIGN PATENT DOCUMENTS

| JP | H01-311211 A | 12/1989 |
| WO | WO 2016/102127 A1 | 6/2016 |
| WO | WO 2018/082892 A1 | 5/2018 |

OTHER PUBLICATIONS

International Search Report and Written Opinion of the International Searching Authority directed to related International Patent Application No. PCT/EP2019/056288, dated Jul. 11, 2020; 9 pages.

(Continued)

*Primary Examiner* — Christina A Riddle
(74) *Attorney, Agent, or Firm* — Sterne, Kessler, Goldstein & Fox P.L.L.C.

(57) ABSTRACT

The invention provides a level sensor to measure a position of a surface of a substrate, comprising a projection unit arranged to direct a beam of radiation to the surface of the substrate and a detection unit. The detection unit comprises a detection grating arranged to receive the beam of radiation reflected on the surface of the substrate, one or more detectors, one or more optical elements to direct the beam of radiation from the detection grating to the one or more detectors, and a processing unit to determine the position of the surface of the substrate on the basis of the beam of radiation received by the one or more detectors. The detection grating and the one or more optical elements are integrated in a single integrated optical element.

14 Claims, 6 Drawing Sheets

(58) Field of Classification Search
CPC .............. G03F 7/7015; G03F 7/70158; G03F 7/70191; G03F 7/70308; G03F 7/70316; G03F 7/70616–70683; G03F 7/70808; G03F 7/70825; G03F 7/70841; G03F 7/7085; G03F 7/70991
USPC ... 355/18, 40, 46, 50, 52–57, 60, 66, 72–77; 356/601–624, 399–401; 430/22, 30; 250/492.1, 492.2, 492.22, 493.1, 505.1, 250/504 R; 359/558, 566–576
See application file for complete search history.

(56) References Cited

U.S. PATENT DOCUMENTS

| | | | |
|---|---|---|---|
| 5,483,056 A * | 1/1996 | Imai | G03F 9/7026 250/201.4 |
| 6,303,934 B1 | 10/2001 | Daly et al. | |
| 6,952,253 B2 | 10/2005 | Lof et al. | |
| 7,265,364 B2 | 9/2007 | Teunissen et al. | |
| 7,646,471 B2 | 1/2010 | Teunissen et al. | |
| 2006/0268269 A1 | 11/2006 | Warren | |
| 2009/0305175 A1 | 12/2009 | Hidaka et al. | |
| 2010/0233600 A1 | 9/2010 | Den Boef et al. | |
| 2011/0096311 A1 * | 4/2011 | Butler | G03F 7/70358 355/53 |
| 2013/0050674 A1 * | 2/2013 | Prosyentsov | G03F 9/7088 355/72 |
| 2013/0077079 A1 | 3/2013 | Den Boef et al. | |
| 2013/0128247 A1 | 5/2013 | Khuat Duy et al. | |
| 2014/0049761 A1 | 2/2014 | Goodwin et al. | |
| 2018/0341188 A1 * | 11/2018 | Reijnders | G03F 9/7026 |

OTHER PUBLICATIONS

Notice of Reasons for Refusal directed to related Japanese Patent Application No. 2020-551462, dated Oct. 22, 2021; 8 pages.

* cited by examiner

LEVEL SENSOR AND LITHOGRAPHIC APPARATUS

CROSS-REFERENCE TO RELATED APPLICATIONS

This application claims priority of EP application 18166754.4 which was filed on 11 Apr. 2018 and which is incorporated herein in its entirety by reference.

FIELD

The present invention relates to a level sensor and a lithographic apparatus comprising such level sensor.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

A topography measurement system, level sensor or height sensor, and which may be integrated in the lithographic apparatus, is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

An example of a level or height sensor LS as known in the art is schematically shown in FIG. 2, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR comprises a structure resulting in a beam of radiation BE1 having a spatially patterned light intensity. The beam of radiation BE1 with the spatially patterned light intensity is directed towards a measurement location MLO on a substrate W having an angle of incidence ANG with respect to an axis perpendicular (Z-axis) to the incident substrate surface between 0 degrees and 90 degrees, typically between 70 degrees and 87 degrees. At the measurement location MLO, the spatially patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of beams of radiation BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

The position of the surface of the substrate is typically determined by determining a shift in the projected projection grating pattern that is reflected by the surface of the substrate. In an embodiment of a level sensor, as for example disclosed in US 2013/0077079, incorporated herein by reference, the detection grating, typically comprising a repeating rooftop pattern, is used to split the beam of radiation as reflected by the surface of the substrate in a first beam part and a second beam part. A change in the light intensity balance between the first beam part and the second beam part, as detected by the one or more detectors, can be used to determine the shift in the projection grating pattern as received by the detection unit. On the basis of this shift the height of the surface of the substrate can be calculated by the processing unit.

In this known embodiment of the level sensor, multiple optical elements, such as mirrors and lenses, are provided to guide the beam parts from the detection grating to the one or more detectors. These multiple optical elements, generally indicated as splitting optics, have a relatively complex structure and require a relatively large volume.

Furthermore, a large part of the light entering the splitting optics, typically about 50%, is lost in these multiple optical elements. This results in a relatively low signal-to-noise ratio of the level sensor. This light loss could be compensated by using a radiation source that provides more light power. However increasing the light power of the radiation source may result in some other drawbacks, such as pre-expose of the resist layer of the substrate, a light contamination risk for all level sensors.

SUMMARY

It is an object of the invention to provide a level sensor that lacks one or more of the above drawbacks of the known embodiment of the level sensor.

According to an aspect of the invention, there is provided a level sensor to measure a position of a surface of a substrate, comprising:
  a projection unit arranged to direct a beam of radiation to the surface of the substrate,
  a detection unit comprising:
  a detection grating arranged to receive the beam of radiation reflected on the surface of the substrate,
  one or more detectors,
  one or more optical elements to direct the beam of radiation from the detection grating to the one or more detectors, and
  a processing unit to determine the position of the surface of the substrate on the basis of the beam of radiation received by the one or more detectors,
wherein the detection grating and the one or more optical elements are integrated in a single integrated optical element.

The single integrated optical element is an element in which the one or more optical elements are arranged in a single device. This single device may be relatively compact. Furthermore, the optical path through the single integrated optical element may be relatively short, since the beam of radiation only has to pass one single integrated optical element from the detection grating to the optical parts directing the beam of radiation to the one or more detectors. It is remarked that the term 'integrated' in single integrated optical element refers to the combination of a detection grating and one or more optical elements to direct the beam of radiation from the detection grating to the one or more detectors arranged in a single compact device. This term does not relate to the optic elements being provided as on-chip devices.

In an embodiment, the single integrated optical element is a monolithic element or acts as a monolithic element. A monolithic element is a single element that is formed from one, or a single, block of material. A corresponding element may be composed of sub-elements that are fixed to each other, for example by gluing, to form a single block of material. The sub-elements preferably are made of the same material.

In an embodiment, the one or more detectors are integrated in the single integrated optical element. By also integrating the one or more detectors in the single integrated optical element, the splitting optics can be provided in a more compact device.

In an embodiment, the single integrated optical element comprises a block of transparent material, wherein the detection grating is arranged on the block of transparent material and/or formed on or in a surface of the block of transparent material. The block of transparent material may have any suitable shape arranged to guide the beam of radiation from detection grating to the one or more optical elements to direct the beam of radiation from the detection grating to the one or more detectors.

In an embodiment, the one or more detectors are arranged on the block of transparent material. By arranging, or fixating, the detectors on the block of transparent material, the compactness of the splitting optics from detection grating to the detectors may be increased further.

In an embodiment, the block of transparent material comprises at least one reflective surface configured to reflect the beam, or part thereof, to the one or more detectors.

In an embodiment, the at least one reflective surface has a curved shape configured to focus the beam, or part thereof, on the one or more detectors. In this embodiment a curved reflective surface may be used to focus the beam of radiation on the one or more detectors. This may obviate the need of a lens element to focus the beam of radiation on the one or more detectors.

In an embodiment, the detection grating is configured to split the beam of radiation in a first beam part and a second beam part, wherein the one or more detectors are configured to receive the first beam part and the second beam part.

In an embodiment, the one or more optical elements comprise a first lens configured to focus the first beam part on the one or more detectors and a second lens configured to focus the second beam part on the one or more detectors, wherein the first lens and the second lens are integrated in the single integrated optical element.

In an embodiment, the projection unit is configured to direct an array of multiple beams of radiation to the surface of the substrate, and wherein the detection grating is configured to receive the multiple beams of radiation reflected on the surface of the substrate.

In an embodiment, the one or more optical elements comprise one or more first lenses for each first beam part of each beam of radiation configured to focus the respective first beam part on the one or more detectors and one or more second lenses for each second beam part of each beam of radiation configured to focus the respective second beam part on the one or more detectors. By providing one or more first and second lenses, for example micro-lenses, for each of the first beam part and the second beam part the focus performance of the first beam part and the second beam part on the one or more detectors may be improved.

In an embodiment, the one or more optical elements comprise a first lens for all first beam parts of the multiple beams of radiation configured to focus the first beam parts on the one or more detectors and a second lens for all second beam parts of the multiple beams of radiation configured to focus the second beam parts on the one or more detectors.

In an embodiment, the one or more optical elements to direct the beam of radiation from the detection grating to the detector comprises at least one lens, for example a microlens, for each of the multiple beams of radiation.

In an embodiment, the detection unit comprises a collimator lens element configured to collimate the beam of radiation after reflection on the surface of the substrate, in the optical path, and before the beam of radiation is received by the detection grating.

In an embodiment, the projection unit comprises a radiation source configured to provide a beam of radiation, and a projection grating comprising a structure, configured to receive the beam of radiation and to provide a beam of radiation with a spatially patterned light intensity.

According to an aspect of the invention, there is provided a lithographic apparatus, comprising:
 a patterning device support constructed to support a patterning device, the patterning device being capable of imparting the radiation beam with a pattern in its cross-section to form a patterned radiation beam;
 a substrate support constructed to hold a substrate;
 a projection system configured to project the patterned radiation beam onto a target portion of the substrate;
wherein the lithographic apparatus comprises the level sensor to measure a position of a surface of a substrate supported on the substrate support, wherein the level sensor comprises:
 a projection unit arranged to direct a beam of radiation to the surface of the substrate,
 a detection unit comprising:
 a detection grating arranged to receive the beam of radiation reflected on the surface of the substrate,
 one or more detectors,
 one or more optical elements to direct the beam of radiation from the detection grating to the one or more detectors, and
 a processing unit to determine the position of the surface of the substrate on the basis of the beam of radiation received by the one or more detectors,
wherein the detection grating and the one or more optical elements are integrated in a single integrated optical element.

The level sensor of the invention may advantageously be applied in a lithographic apparatus. The level sensor may also be applied in other apparatuses arranged to measure characteristics of a substrate, other than a position of a surface of the substrate, or process a substrate, for example a metrology apparatus or an e-beam inspection tool.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
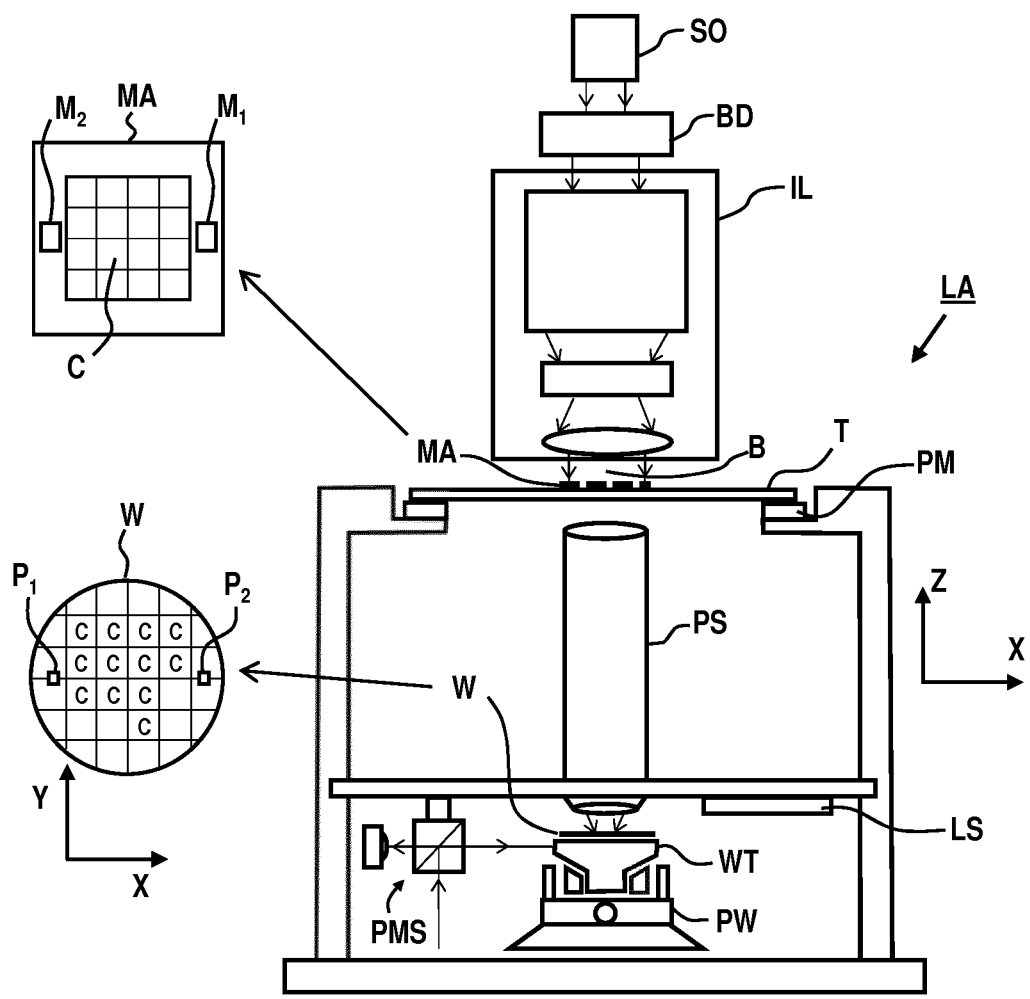
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

A level sensor LS is integrated in the lithographic apparatus LA of FIG. 1. The level sensor LS is arranged to measure a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). The level sensor LS may also be provided as a separate device.

Figure 2:
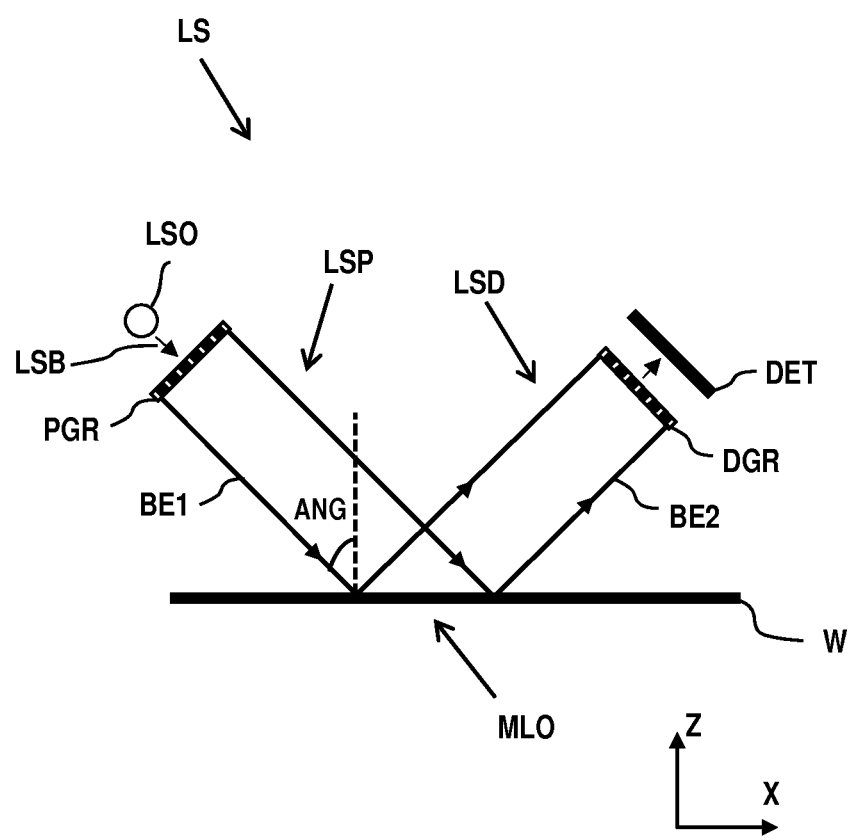
FIG. 2 depicts schematically an embodiment of a prior art level sensor, which illustrates the principles of operation.

As discussed above, in the 'Background' section of this patent application, an example of a level or height sensor LS as known in the art is schematically shown in FIG. 2, which illustrates the principles of operation.

Figure 3:
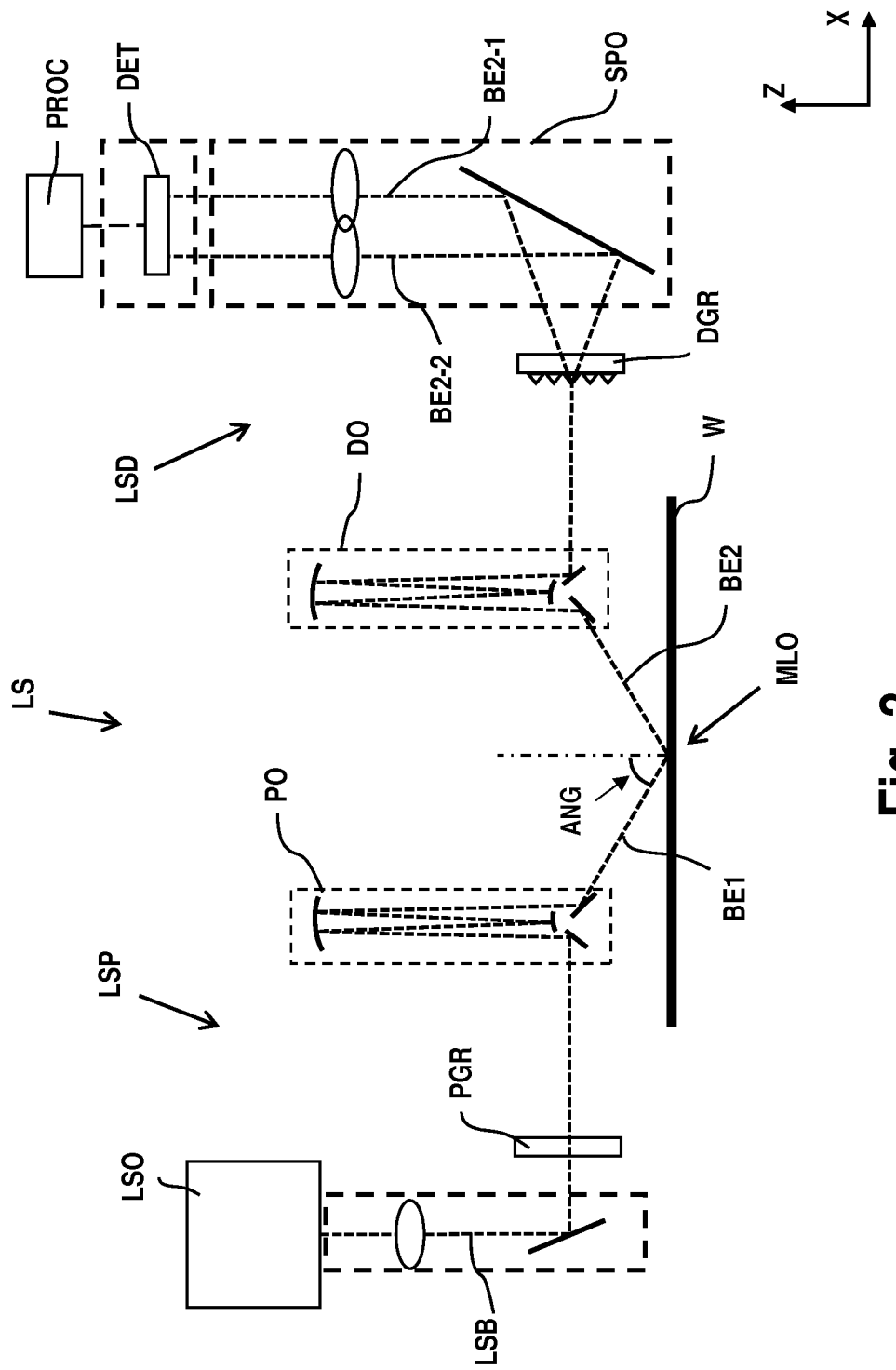
FIG. 3 depicts an embodiment of a prior art level sensor in more detail.

FIG. 3 shows a prior art embodiment of a level sensor LS in more detail. FIG. 3 shows that the level sensor LS comprises a number of optical elements that are required to guide the beam of radiation BE1, BE2 from the radiation source LSO to the detector DET. The optical elements can be subdivided in a number of groups of optical elements, as indicated in FIG. 3. The input optics IO guide the beam of radiation LSB to the projection grating PGR of the projection unit LSP. The projection unit LSP further comprises projection optics PO that direct the beam of radiation BE1 to the measurement location MLO on the surface of substrate W.

The beam of radiation BE2 that is reflected from the surface of the substrate W is received by detection optics DO of the detection unit LSD. The detection optics DO directs the beam of radiation BE2 to the detection grating DGR. The detection grating DGR splits the beam of radiation BE2 in a first beam part BE2-1 and a second beam part BE2-2. A number of optical elements, indicated as splitting optics SPO are provided to direct the beam of radiation, in particular the first beam part BE2-1 and the second beam part BE2-2 from the detection grating DGR to the detector DET. It is remarked that in FIG. 3 one detector is shown, but in practice multiple detectors DET may be provided, for example a first detector to measure the light intensity of the first beam part BE2-1 and a second detector to measure the light intensity of the second beam part BE2-2.

The level sensor LS comprises a processing unit PROC arranged to receive one or more sensor signals representative for the light intensity of the first beam part BE2-1 and for the light intensity of the second beam part BE2-2, as measured by the detector or the plurality of detectors DET. The processing unit PROC may be any suitable processing unit, such as a dedicated processing unit of the level sensor, or a central processing of the lithographic apparatus LA.

A different height of the surface of the substrate W at the measurement location MLO will result in a shift of the projected grating pattern imparted by the projection grating PGR in the reflected beam of radiation BE2. This shift in the projected grating pattern results in a change in the distribution of the beam of radiation BE2 over the first beam part BE2-1 and the second beam part BE2-2. By comparison of the light intensity of the first beam part BE2-1 and the light intensity of the second beam part BE2-2, as measured by the detector DET, the shift in the projected grating pattern can be determined and used in the processing unit PROC to calculate a height or difference in height of the surface of the substrate W.

Generally, the relationship between height $W_{height}$ of the surface of the substrate W and the first beam part BE2-1 and the second beam part BE2-2 can be described as:

$$W_{height} \propto \frac{I_{BE2-1} - I_{BE2-2}}{I_{BE2-1} + I_{BE2-2}},$$

wherein $W_{height}$ is the height of the surface of the substrate W, at the measurement location MLO where the beam of radiation BE-1 reflects on this surface, $I_{BE2-1}$ is the light intensity of the first beam part BE2-1 and $I_{BE2-2}$ is the light intensity of the second beam part BE2-2.

In practice, the splitting optics SPO are of a relatively complex design and require a relatively large volume. Furthermore, the loss of light in the splitting optics SPO is significantly, for example about 50%. This result in signal loss and therefore in a relatively low signal-to-noise ratio of the level sensor LS.

A possible solution for this signal loss is to increase the power of the radiation source LSO. However, this increase in light power has some drawbacks and is therefore limited. In particular, an increase in light power has the risk of pre-expose of the resist layer of the substrate W. This is generally undesirable. Furthermore, increased light power increases the risk of light contamination between different parts of the level sensor, and possibly other light sensors. For example in known embodiments of a level sensor, multiple beams of radiation are provided in an array next to each other to simultaneously measure the height of the substrate at different adjacent measurement locations. Increasing the light power may result in commingling of the multiple beams of radiation, and therewith false measurements. Another drawback of the provision of increased light power is that a novel radiation source LSO should be designed that may require a larger volume to accommodate for the increased light power.

Figure 4:
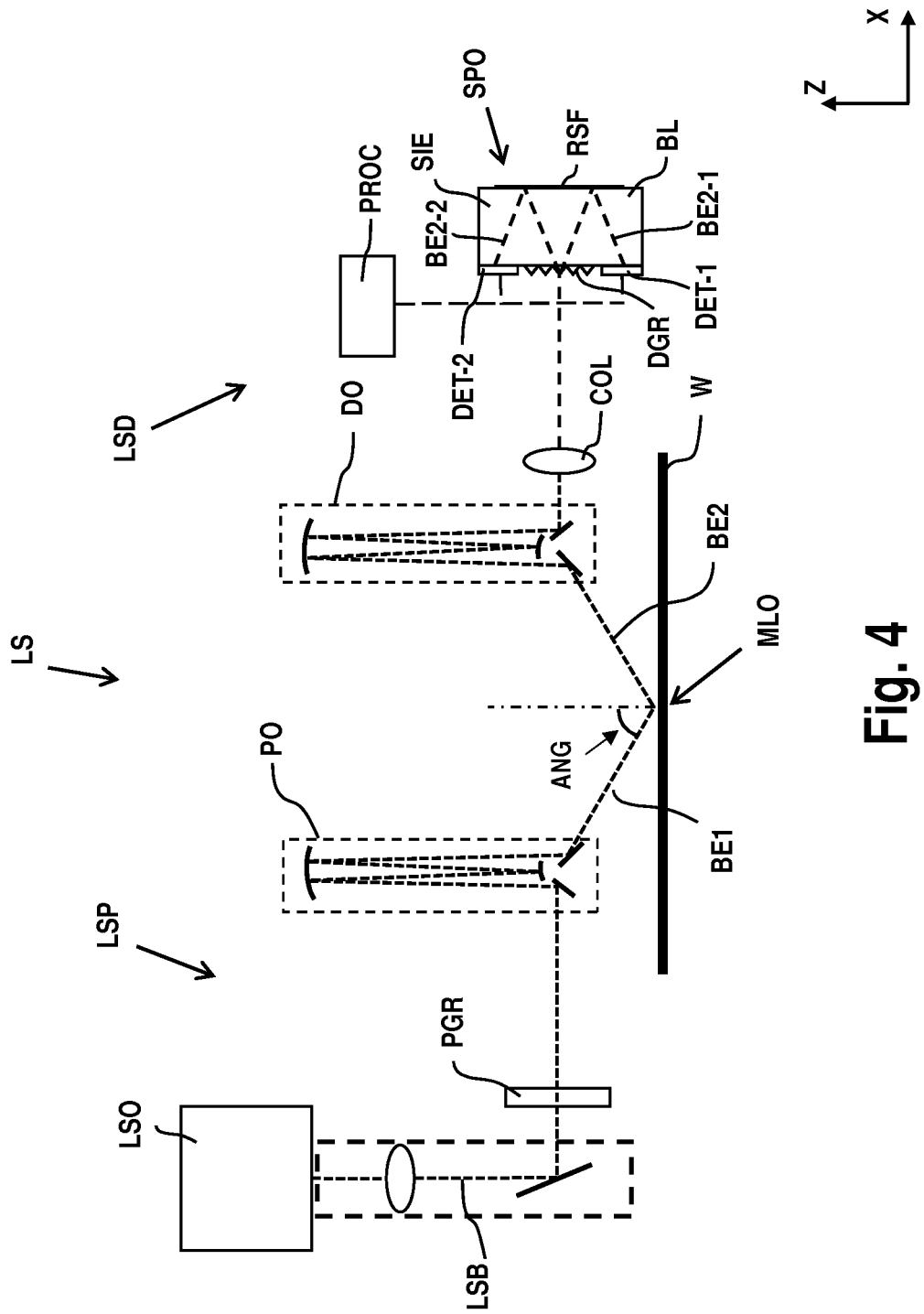
FIG. 4 depicts an embodiment of a level sensor according to a first embodiment of the invention.

FIG. 4 shows a level sensor LS to measure a position of a surface of a substrate W at a measurement location MLO according to a first embodiment of the invention. The level sensor LS is generally constructed the same as the level sensor LS shown in FIG. 3.

The main difference between the level sensor LS of FIG. 3 and the level sensor LS of FIG. 4 is that the detection grating DGR and the splitting optics SPO are integrated in a single integrated optical element SIE. A collimator lens COL may be arranged to provide guide a collimated beam of radiation BE2 to the single integrated optical element SIE. The collimator lens COL may for example be part of the detection optics DO.

Figure 5:
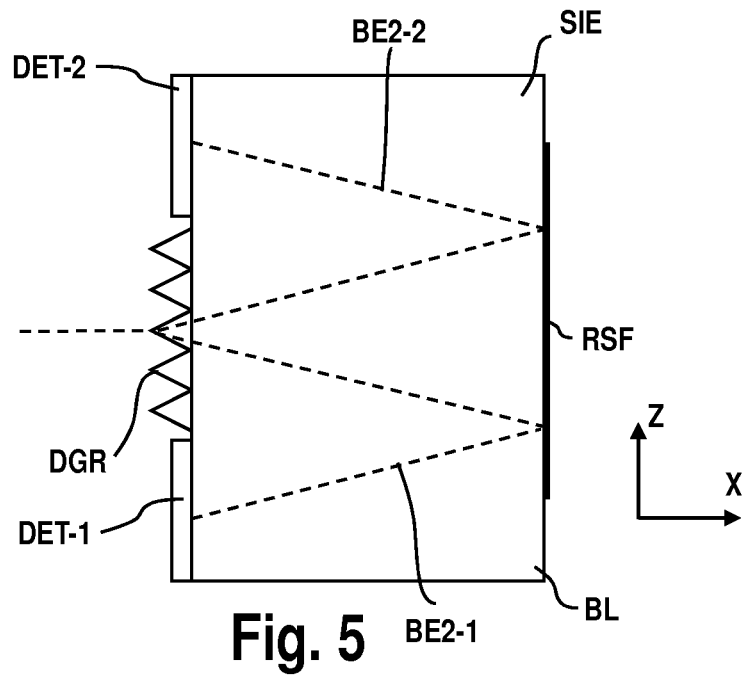
FIG. 5 depicts the single integrated optical element of the embodiment of FIG. 4 in more detail.

FIG. 5 shows the single integrated optical element SIE in more detail. The single integrated optical element SIE comprises in this embodiment a block of transparent material BL, for instance a block of glass. The detection grating DGR is fixed on the block of transparent material BL, for example by gluing. In an alternative embodiment the detection grating DGR may be formed on or in the surface of the block of transparent material BL. The first beam part BE2-1 and the second beam part BE2-2 propagate through the material of the block of transparent material BL. It will be clear for the skilled person that the block of transparent material BL should be sufficiently transparent in order to transmit the first beam part BE2-1 and the second beam part BE2-2.

The level sensor LS comprises a first detector DET-1 to measure the light intensity of the first beam part BE2-1 and a second detector DET-2 to measure the light intensity of the second beam part BE2-2. The first detector DET-1 and the second detector DET-2 are also integrated in the single integrated optical element SIE. Typically, the first detector DET-1 and the second detector DET-2 are fixed on the surface of the block of transparent material BL, for example by gluing.

At a side of the block of transparent material BL opposite to a side where the detection grating DGR is arranged, a reflective surface RSF is provided. The reflective surface RSF reflects the first beam part BE-1 and the second beam part BE-2 coming from the detection grating DGR to the first detector DET-1 and the second detector DET-2, respectively. The reflective surface RSF may be formed by the material of the block of transparent material BL itself and/or a reflective coating may be provided on the block of transparent material BL.

The single integrated optical element SIE with integrated detection grating DGR and splitting optics SPO is a monolithic element or acts as a monolithic element. This means that a single block of material is provided to receive the beam of radiation BE2 from the detection optics DO, whereby the detection grating DGR of the monolithic element splits the beam of radiation BE2 in a first beam part BE2-1 and a second beam part BE2-2, and the monolithic element further directs the first beam part BE2-1 and the second beam part BE2-2 to the respective first detector DET-1 and the second detector DET-2.

The main advantage of the single integrated optical element is that the volume required for the detection grating DGR and the splitting optics SPO, i.e. the optical elements between the detection grating DGR and the detectors DET is substantially reduced. The single integrated optical element SIE may for example be placed on the bottom of a frame part of a metrology frame of the lithographic apparatus LA or of any other apparatus comprising the level sensor, e.g. a metrology or inspection apparatus. Furthermore, the relatively small block of transparent material BL will typically have a relatively low loss of light. This ensures that the level sensor LS may have a good signal-to-noise ratio without the need of applying a radiation source LSO with high power.

It is remarked that in order to create more optical path length for the first beam part BE2-1 and the second beam part BE2-2 in a relatively small block of transparent material BL, more reflective surfaces RSF may be provided such that the first beam part BE2-1 and the second beam part BE2-2 may be reflected multiple times before being received by the respective detector DET-1, DET-2. This longer optical path length may for example be used to create more separation between the different beams.

Figure 6:
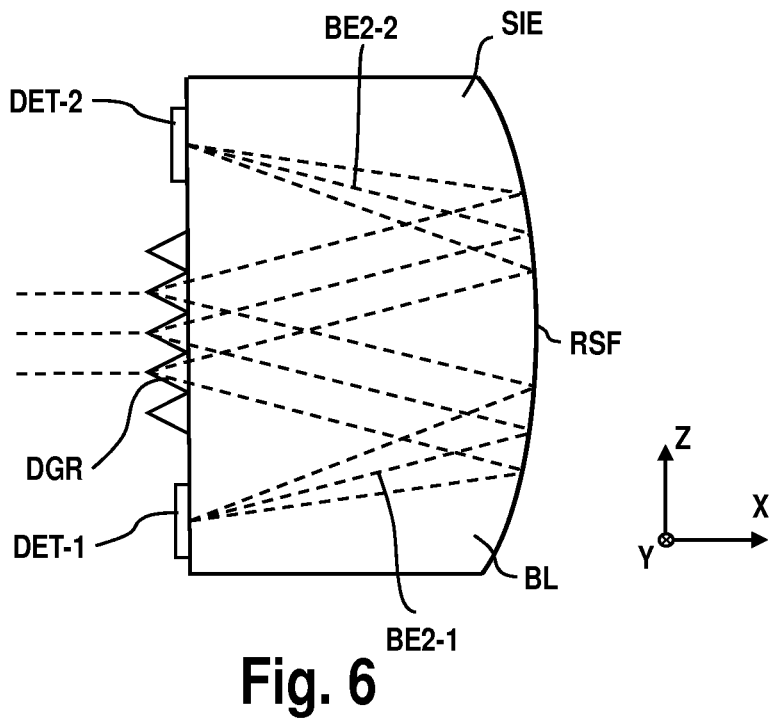
FIG. 6 depicts a first alternative embodiment of a single integrated optical element.

FIG. 6 shows a second embodiment of a single integrated optical element SIE according to the invention. This embodiment also comprises a block of transparent material BL. On a first side of the block of transparent material BL the detection grating DGR and the first detector DET-1 and the second detector DET-2 are arranged, and, at a second side, opposite to the first side, a reflective surface RSF is provided to direct the first beam part BE2-1 and the second beam part BE2-2 coming from the detection grating DGR to the first detector DET-1 and the second detector DET-2, respectively.

In the embodiment of FIG. 6, the reflective surface RSF is curved, whereby the shape, or curvature, of the reflective surface RSF is designed to focus the first beam part BE2-1 on the first detector DET-1 and the second beam part BE2-2 on the second detector DET-2. By using a curved reflective surface RSF to focus the first beam part BE2-1 and the second beam part BE2-2 on the respective detector DET-1, DET-2, smaller detectors may be used in the single integrated optical element SIE, for example single photodiodes. Furthermore, the focusing of the first beam part BE2-1 and the second beam part BE2-2 may generally decrease the volume required for the single integrated optical element SIE.

The reflective surface RSF of the embodiment of FIG. 6 is curved about the y-axis. In another embodiment the reflective surface RSF may be curved about two axes, for example about the Y-axis and the Z-axis. This could further improve the focusing of the first beam part BE2-1 on the first detector DET-1 and the second beam part BE2-2 on the second detector DET-2.

It is remarked that in an embodiment, the shape or the curvature of the reflective surface RSF may further be designed to align the sub-beams of the first beam part BE2-1 and the second beam part BE2-2. This would obviate the need of a separate collimation lens arranged, in the optical path, before the detection grating DGR, such as the collimator lens COL shown in FIG. 4.

Figure 7:
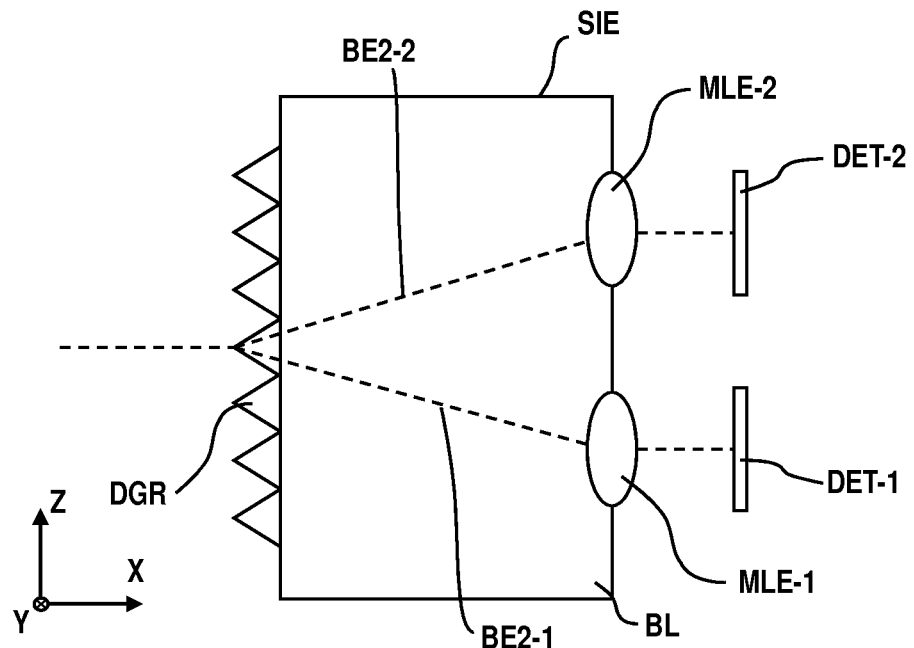
FIG. 7 depicts a second alternative embodiment of a single integrated optical element.

FIG. 7 shows, in side view, a third embodiment of a single integrated optical element SIE according to the invention. The single integrated optical element SIE comprises a block of transparent material BL with integrated detection grating DGR at one side of the block of transparent material BL. At the opposite side of the block of transparent material BL, a first lens MLE-1 and a second lens MLE-2 are provided. The first and second lenses MLE-1, MLE-2 are in an embodiment micro-lenses, which are relatively small lenses. The lenses MLE-1, MLE-2 are fixed onto the block of transparent material BL, for example by gluing. In an alternative embodiment, the lenses MLE-1, MLE-2 may be formed into the block of transparent material BL.

The first lens MLE-1 is arranged to direct the first beam part BE2-1 to the first detector DET-1. Correspondingly, the second lens MLE-2 is arranged to direct the second beam part BE2-2 to the second detector DET-2. Thus, instead of a reflective surface RSF as provided in the embodiments of FIGS. 5 and 6, the embodiment of FIG. 7 comprises lenses integrated in the single integrated optical element SIE. The first detector DET-1 and the second detector DET-2 of this embodiment are in this embodiment not integrated in the single integrated optical element SIE. In a further embodiment (not shown) the first and second lenses MLE-1, MLE-2 are integrated inside the single integrated optical element SIE and the first and second detectors DET-1, DET-2 are arranged on a surface of the single integrated optical element SIE facing the first and second lenses MLE-1, MLE-2, respectively.

In practice, a level sensor LS may be configured to provide an array of beams of radiation BE that are propagated through the projection grating PGR to form an array of beams of radiation BE-1 with varying intensity, and projected by the projection optics PO onto the surface of the substrate on multiple adjacent measurement locations MLO.

The array of beams of radiation BE-2 reflected on the surface of the substrate W at the adjacent measurement locations MLO may be guided through the projections optics PO to the single integrated optical element SIE.

Figure 8:
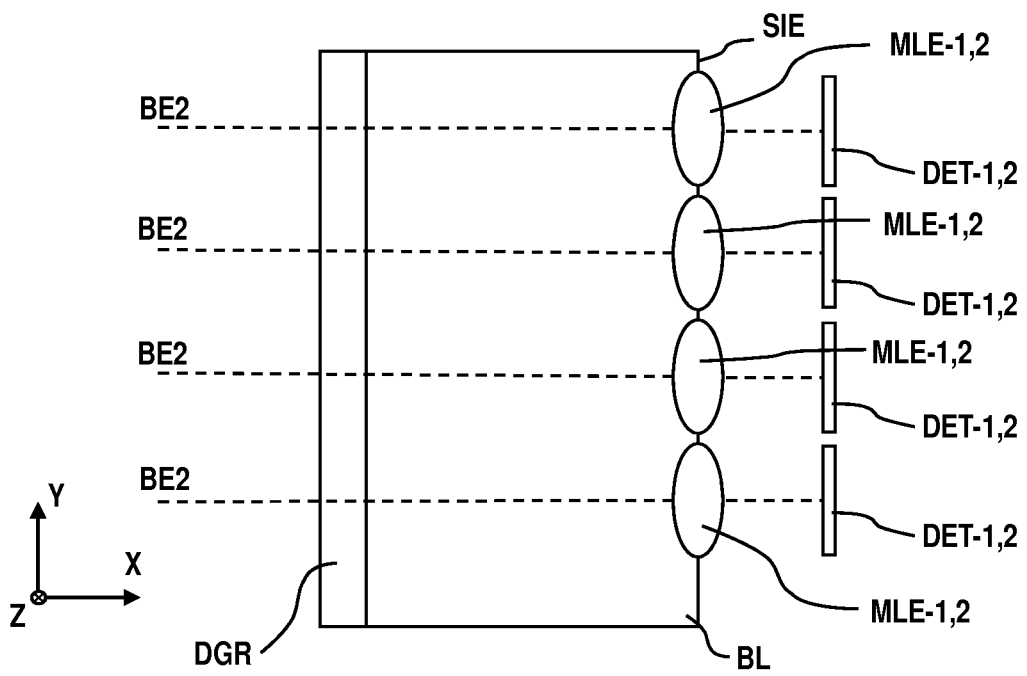
FIG. 8 depicts a top view of the embodiment of FIG. 7.

FIG. 8 shows a top view of the single integrated optical element SIE corresponding to the single integrated optical element SIE shown in FIG. 7. In FIG. 8, four adjacent beams of radiation BE2 are shown. In practice the number of adjacent beams of radiation may be considerably larger. For example, the radiation source LSO may provide an array of 35 adjacent beams of radiation.

Each of the beams of radiation BE2 is split by the detection grating DGR in a first beam part and a second beam part. For each first beam part a first lens MLE-1 is provided to focus the respective first beam part BE2-1 on the respective first detector DET-1. Correspondingly, for each second beam part a second lens MLE-2 is provided to focus the respective second beam part on the respective second detector DET-2. Since the first lens MLE-1 and the second lens MLE-2 are arranged above each other, the first lens MLE-1 and the second lens MLE-2 are together indicated in FIG. 8 as MLE-1,2. Similarly, the first detector DET-1 and the second detector DET-2 are together indicated in FIG. 8 as DET-1,2.

Thus, for each first beam part and each second beam part of the array of beams of radiation BE2 a separate micro-lens MLE-1 or MLE-2 is provided. This has the advantage that each first and second beam part can optimally be focused on its associated detector DET-1 or DET-2.

It is remarked that the provision of dedicated lenses, e.g. micro-lenses, for each beam part may also be advantageous in embodiments in which the lenses are not integrated in a single integrated optical element SIE or even without a single integrated optical element SIE. For example, in the embodiment of FIG. 3, a single micro-lens may be provided for each beam part in the splitting optics SO.

In an alternative embodiment of the embodiment of FIGS. 7 and 8 (not shown), a first lens element may be provided to direct and/or focus all first beam parts BE2-1 of the array of beams of radiation BE2 to the associated detectors DET-1 and a second lens element may be provided to direct and/or focus all second beam parts BE2-2 of the array of beams of radiation BE2 to the associated detectors DET-2. The first lens element and the second element are preferably integrated in the single integrated optical element SIE.

In a yet another alternative embodiment, the single integrated optical element SIE may comprise one lens element for each combination of first beam part BE2-1 and second beam part BE2-2, or one lens element may be provided for all first beam parts BE2-1 and second beam parts BE2-2 of the array of beams of radiation BE2.

Hereinabove, embodiments of a single integrated optical element SIE have been described in which a transmissive detection grating is provided. In alternative embodiments, the detection grating may be a reflective element, for example a reflective element having a rooftop pattern on which the beam of radiation is reflected.

The single integrated optical element SIE as has been described in embodiments hereinabove may be configured to be movable and/or rotatable. In this way it is provided that the single integrated optical element SIE may be aligned to the first and second beam parts, e.g. during a calibration process. Moving and/or rotating the single optical element may be implemented by various known techniques for moving and/or rotating optical elements.

The level sensor as has been described in embodiments hereinabove may also be applied, or used, other than a lithographic apparatus for measuring a position of a surface of the substrate. For example, the level sensor may be applied in a metrology apparatus which is configured to measure a characteristic of the substrate other than the position of the surface of the substrate, for example an alignment parameter, an overlay parameter and/or characteristics of defects on the substrate. For example, the level sensor according to embodiments may be applied in, or integrated in, an e-beam inspection apparatus.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, an e-beam inspection tool or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A level sensor comprising:
a projection unit arranged to direct a beam of radiation to a surface of a substrate;
a detection unit comprising:
 a detection grating arranged to receive the beam of radiation reflected on the surface of the substrate;
 one or more detectors; and
 one or more optical elements configured to direct the beam of radiation from the detection grating to the one or more detectors; and
a processing unit configured to determine a position of the surface of the substrate based on the beam of radiation received by the one or more detectors,
wherein the detection grating and the one or more optical elements are integrated in a monolithic element formed from a single block of material.

2. The level sensor of claim 1, wherein the one or more detectors are integrated with the monolithic element.

3. The level sensor of claim 1, wherein the monolithic element comprises:
a block of transparent material,
wherein the detection grating is arranged on the block of transparent material and/or formed on or in a surface of the block of transparent material.

4. The level sensor of claim 3, wherein the one or more detectors are arranged on the block of transparent material.

5. The level sensor of claim 3, wherein the block of transparent material comprises at least one reflective surface configured to reflect the beam, or part thereof, to the one or more detectors.

6. The level sensor of claim 5, wherein the at least one reflective surface has a curved shape configured to focus the beam, or part thereof, on the one or more detectors.

7. The level sensor of claim 1, wherein:
the detection grating is configured to split the beam of radiation into a first beam part and a second beam part; and
the one or more detectors are configured to receive the first beam part and the second beam part.

8. The level sensor of claim 7, wherein:
the one or more optical elements comprise a first lens configured to focus the first beam part on the one or more detectors and a second lens configured to focus the second beam part on the one or more detectors; and
the first lens and the second lens are integrated with the monolithic element.

9. The level sensor of claim 7, wherein the one or more optical elements comprise:
one or more first lenses for each first beam part of each beam of radiation configured to focus the respective first beam part on the one or more detectors; and
one or more second lenses for each second beam part of each beam of radiation configured to focus the respective second beam part on the one or more detectors.

10. The level sensor of claim 7, wherein the one or more optical elements comprise:
a first lens for all first beam parts of the multiple beams of radiation configured to focus the first beam parts on the one or more detectors; and
a second lens for all second beam parts of the multiple beams of radiation configured to focus the second beam parts on the one or more detectors.

11. The level sensor of claim 7, wherein the one or more optical elements to direct the beam of radiation from the detection grating to the detector comprises at least one lens for each of the multiple beams of radiation.

12. The level sensor of claim 1, wherein:
the projection unit is configured to direct an array of multiple beams of radiation to the surface of the substrate; and
the detection grating is configured to receive the multiple beams of radiation reflected on the surface of the substrate.

13. The level sensor of claim 1, wherein the detection unit comprises a collimator lens element configured to collimate the beam of radiation after reflection on the surface of the substrate, in the optical path, and before the beam of radiation is received by the detection grating.

14. An apparatus comprising:
   a level sensor comprising:
      a projection unit arranged to direct a beam of radiation to a surface of a substrate;
      a detection unit comprising:
         a detection grating arranged to receive the beam of radiation reflected on the surface of the substrate;
         one or more detectors; and
         one or more optical elements configured to direct the beam of radiation from the detection grating to the one or more detectors; and
      a processing unit configured to determine a position of the surface of the substrate based on the beam of radiation received by the one or more detectors,
   wherein the detection grating and the one or more optical elements are integrated in a monolithic element formed from a single block of material, and
   wherein the level sensor is configured to measure a position of the surface of the substrate supported on a substrate support.

\* \* \* \* \*